United States Patent [19]

Akai et al.

[11] 4,158,851
[45] Jun. 19, 1979

[54] SEMI-INSULATING GALLIUM ARSENIDE SINGLE CRYSTAL

[75] Inventors: Shin-ichi Akai; Yasuhiro Nishida; Keiichiro Fujita, all of Osaka, Japan

[73] Assignee: Sumitomo Electric Industries, Ltd., Japan

[21] Appl. No.: 780,186

[22] Filed: Mar. 22, 1977

[30] Foreign Application Priority Data

Mar. 29, 1976 [JP] Japan .................................. 51-34811
Mar. 29, 1976 [JP] Japan .................................. 51-34812

[51] Int. Cl.$^2$ .......................................... H01L 29/167
[52] U.S. Cl. ........................................ 357/63; 357/58; 357/64; 148/33; 252/62.3 GA
[58] Field of Search ............................. 357/63, 64, 58; 252/62.3 GA; 148/33

[56] References Cited

U.S. PATENT DOCUMENTS

| 3,344,071 | 9/1967 | Cronin | 252/62.3 GA |
| 3,994,755 | 11/1976 | Kamath et al. | 252/62.3 GA |
| 4,004,953 | 1/1977 | Otsubo et al. | 252/62.3 GA |

FOREIGN PATENT DOCUMENTS 102570 12/1973 Japan ............................................ 357/63

OTHER PUBLICATIONS

A. Ferro et al., "Properties of Gallium Arsenide Double-Injection Devices", J. of Applied Physics, vol. 42, No. 10, Sep. 1971, pp. 4015-4024.

Primary Examiner—Joseph E. Clawson, Jr.
Attorney, Agent, or Firm—Wenderoth, Lind & Ponack

[57] ABSTRACT

In a semi-insulating gallium arsenide single crystal containing at least one of deep acceptor impurities and at least one of deep donor impurities and having a resistivity of at least about $10^6$ $\Omega$·cm at 300° K., (1) at least one of the deep donor impurities is oxygen, the oxygen concentration in the single crystal being at least about $4 \times 10^{16}$ cm$^{-3}$, while the silicon concentration in the single crystal being simultaneously at most about $2 \times 10^{15}$ cm$^{-3}$, (2) at least one of the deep acceptor impurities is chromium, the chromium concentration in the single crystal being within a range of about $3 \times 10^{15}$ to about $3 \times 10^{17}$ cm$^{-3}$ and (3) at least one of tellurium, tin, selenium and sulfur is contained as another shallow donor impurity than silicon so to satisfy the relationship of $N_{AA} > N_D - N_A > -N_{DD}$ wherein $N_{AA}$ represents the sum of concentrations of the deep acceptor impurities including chromium, $N_{DD}$ represents the sum of concentrations of the deep donor impurities including oxygen, $N_D$ represents the sum of concentrations of the shallow donor impurities including electrically active lattice defects and $N_A$ represents the sum of concentrations of the shallow acceptor impurities including electrically active lattice defects.

4 Claims, 9 Drawing Figures

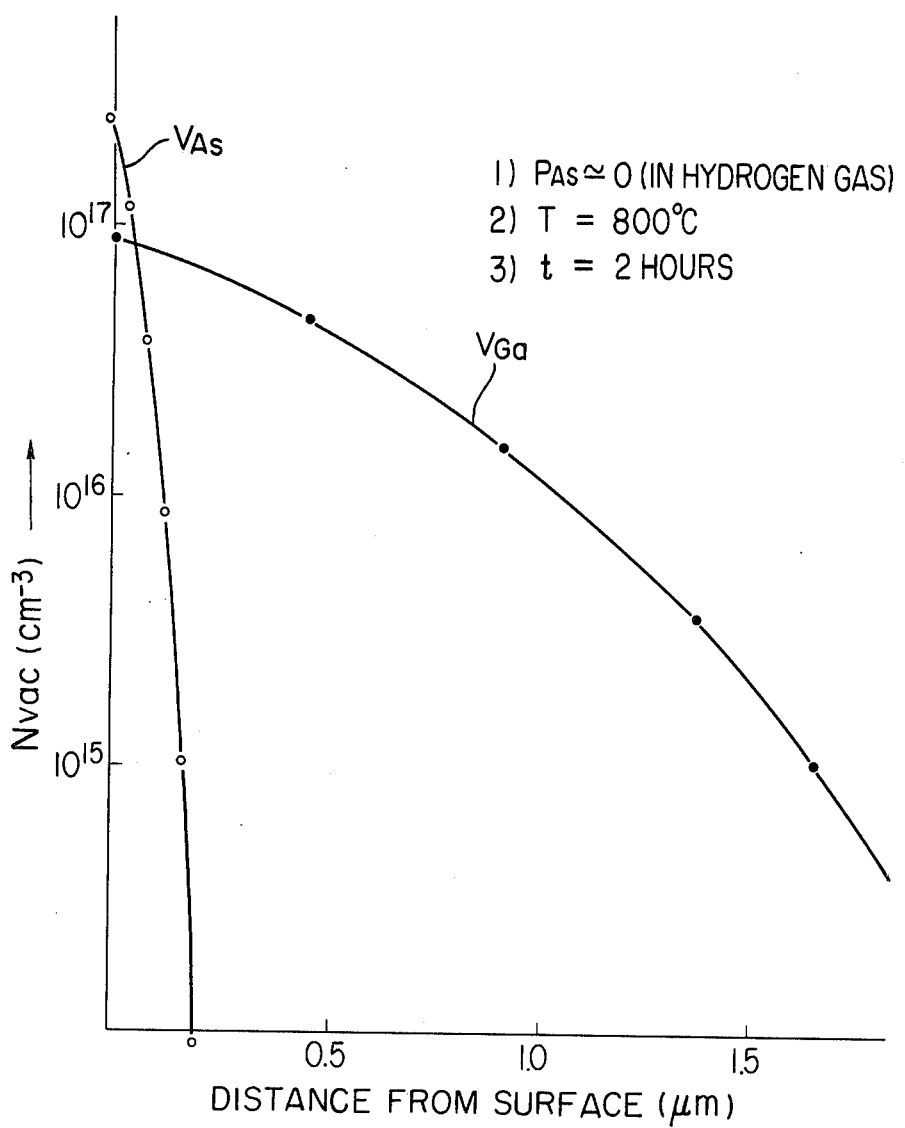

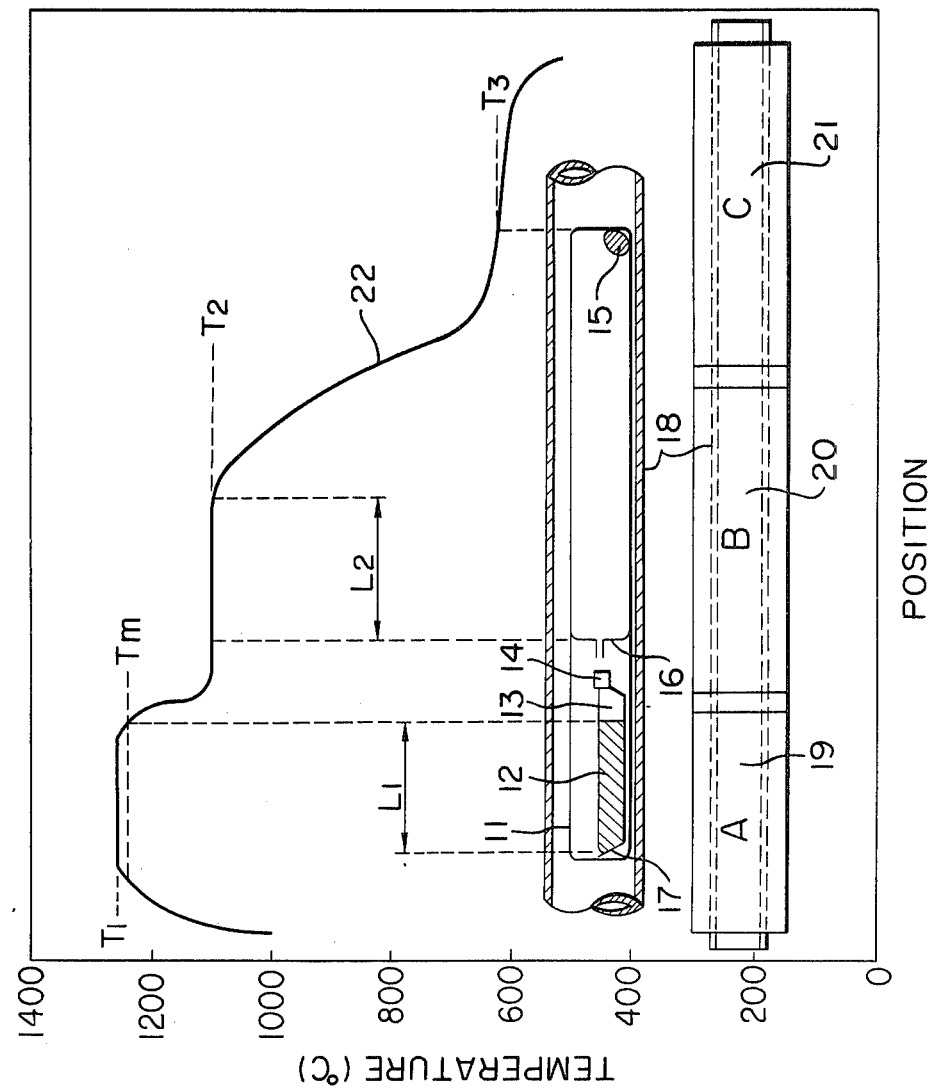

SEMI-INSULATING GALLIUM ARSENIDE SINGLE CRYSTAL

BACKGROUND OF THE INVENTION

1. Field of the Invention

The present invention relates to a stable semi-insulating gallium arsenide single crystal which has a high resistivity in the dark and before being processed and is capable of keeping the high resistivity even under illumination or even after being processed, for example, subjected to annealing treatment or epitaxial growth.

2. Description of the Prior Art

The use of such a semi-insulating gallium arsenide single crystal has lately been enlarged as substrates for various planar type elements, for example, microwave elements such as shottky gate field effect transistors (MESFET) and Gunn diodes, optical semiconductor elements of optical integrated circuits, Hall elements, etc. It is industrially an important problem how the electrical property and crystalline quality of the above described substrates are realized with good reproducibility and, when the above described elements are produced by the epitaxial growth or ion-implantation method, there are many problems, for example, abnormal phenomena occurring at the interface between the semi-insulating gallium arsenide substrate and active layer during the production process, resistance-lowering phenomena of the substrate, etc., resulting in a large obstacle to increasing of the yield of these elements. Furthermore, in view of that the above described elements are often used under some illumination, it is a further problem whether the resistivity thereof is stable for light or not.

SUMMARY OF THE INVENTION

It is an object of the present invention to provide a semi-insulating gallium arsenide single crystal having a high resistivity as well as a high grade crystalline quality with a good reproducibility.

It is another object of the invention to provide a semi-insulating gallium arsenide single crystal stable for various processings by controlling the doping conditions of various impurities so that the electrically active defects occurring during processing of the substrate may be compensated.

It is a further object of the invention to provide a semi-insulating gallium arsenide single crystal stable for illumination by controlling the doping conditions of various impurities so that a high resistivity may be kept under illumination even before being processed or even after being processed.

It is a still further object of the invention to provide a method for successively growing a stable semi-insulating gallium arsenide single crystal with an accurate doping design.

These objects can be attained by a semi-insulating gallium arsenide single crystal containing at least one of deep acceptor impurities and at least one of deep donor impurities and having a resistivity of $10^6$ $\Omega$·cm or more at 300° K., in which (1) at least one of the deep donor impurities is oxygen, the oxygen concentration in the single crystal being about $4 \times 10^{16}$ cm$^{-3}$ or more while the silicon concentration in the single crystal being simultaneously about $2 \times 10^{15}$ cm$^{-3}$ or less, (2) at least one of the deep acceptor impurities is chromium, the chromium concentration in the single crystal being within a range of about $3 \times 10^{15}$ cm$^{-3}$ to about $3 \times 10^{17}$ cm$^{-3}$ and (3) at least one of tellurium, tin, selenium and sulfur is contained as another shallow donor impurity than silicon so as to satisfy the relationship of $N_{AA} > N_D - N_A > -N_{DD}$ wherein $N_{AA}$ represents the sum of concentrations of the deep acceptor impurities including chromium, $N_{DD}$ represents the sum of concentrations of the deep donor impurities including oxygen, $N_D$ represents the sum of concentrations of the shallow donor impurities including electrically active lattice defects and $N_A$ represents the sum of concentrations of the shallow acceptor impurities including electrically active lattice defects.

BRIEF DESCRIPTION OF THE DRAWING

The accompanying drawings are to illustrate in detail the present invention.

FIG. 8 shows the diffusion aspect of both arsenic vacancy and gallium vacancy in the case of annealing the semi-insulating gallium arsenide single crystal at 800° C. for 2 hours in hydrogen gas.

FIG. 9 shows an apparatus, in cross section, for producing the semi-insulating gallium arsenide single crystal by the three temperature horizontal Bridgman method according to the present invention and the temperature distribution profile in this apparatus.

DETAILED DESCRIPTION OF THE INVENTION

Figure 1:
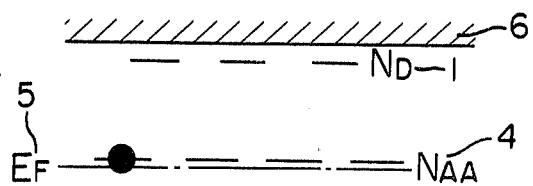
FIG. 1 to FIG. 4 show energy band models to illustrate the basic principle of the present invention, FIG. 1 and FIG. 2 being those of the prior art chromium type and the prior art oxygen type respectively, FIG. 3 being that of the chromium-oxygen mixed type the inventors have proposed and FIG. 4 being that of the other mixed type semi-insulating gallium arsenide.
Figure 2:
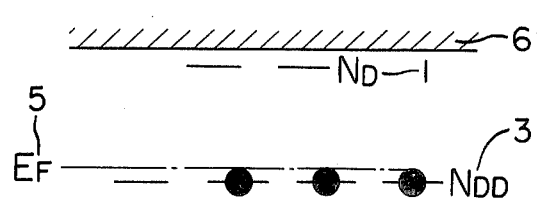
Figure 3:
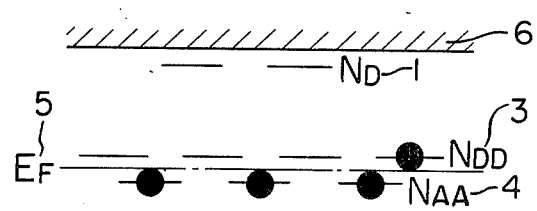

Up to the present time, gallium arsenide crystals having a resistivity of more than $10^6$ $\Omega$·cm at 300° K. have been classified as follows:

(1) Gallium arsenide doped with chromium
(2) Gallium arsenide doped with oxygen
(3) Gallium arsenide doped with oxygen and chromium Problems on these semi-insulating gallium arsenide will now be illustrated by their energy band models. FIG. 1 to FIG. 3 are the energy band models showing respectively the electron states of the chromium type, oxygen type and oxygen-chromium mixed type semi-insulating gallium arsenides. In these figures, 1 ($N_D$) represents the concentration of a shallow donor impurity 2 ($N_A$) represents the concentration of a shallow acceptor impurity, 3 ($N_{DD}$) represents the concentration of a deep donor impurity, 4 ($N_{AA}$) represents the concentration of a deep acceptor impurity, 5 ($E_F$) represents Fermi level, 6 represents the conduction band and 7 represents the valence band. Hereinafter, silicon and arsenic vacancies are taken into consideration as shallow donor impurities, residual acceptors such as copper and gallium vacancy as shallow acceptor impurities, oxygen as a deep donor and chromium as a deep acceptor. It is necessary to obtain a high resistivity that the Fermi level is near the level of chromium or oxygen. The condition to this end is $N_{AA} > N_D - N_A > O$ in FIG. 1. Since one of $N_A$, for example, the concentration of copper, which is considered to come from starting materials and quartz, is dispersed therein to a great extent, it is difficult to control the concentration of copper in gallium arsenide prepared using them, thus resulting in a large dispersion of 1 to $5 \times 10^{15}$ cm$^{-3}$. Furthermore, control of the other of $N_A$, i.e., the density of gallium vacancy is very difficult at present by the prior art commercial process. In order to realize the relationship of $N_{AA} > N_D - N_A > O$ with good reproducibility, therefore, doping must be effected so as to give $N_D$ (=$N_{Si}$) ~ $2 \times 10^{16}$ cm$^{-3}$ and $N_{AA}$ (=$N_{Cr}$) > $4 \times 10^{16}$ cm$^{-3}$. On the other hand, chromium having a small segregation coefficient in gallium arsenide, i.e., about $6 \times 10^{-4}$ and a low solubility therein, i.e., $(3 \sim 4) \times 10^{17}$ cm$^{-3}$ tends to cause constitutionally super cooling and to be precipitated simultaneously during crystal growth. Accordingly, when chromium is doped in a concentration of $4 \times 10^{16}$ cm$^{-3}$ or more, the yield of the single crystal is low and the crystalline qualities are deteriorated although the electrical properties are satisfied. For example, the dislocation density is sometimes increased.

According to the present invention, a semi-insulating gallium arsenide can be obtained even if the density of chromium is less than $4 \times 10^{16}$ cm$^{-3}$, which will be illustrated below.

In FIG. 2, the condition to obtain a high resistivity is $N_{DD} > N_A - N_D > O$. Since $N_A$ is hard to control and has a large dispersion as described above, $N_D$, that is, the silicon density must be adjusted to less than $1 \times 10^{15}$ cm$^{-3}$ in order to satisfy the above described condition. Between the silicon density ($N_{Si}$) and oxygen density ($N_O$) of a gallium arsenide crystal grown by the melt growth method, on the other hand, there is the following relation;

$$N_{Si} \propto (1/N_O)$$

Therefore, $N_{Si}$ is affected by the quantity of residual oxygen during crystal growth, depending on the degree of vacuum and the oxygen concentration in starting materials, so it is difficult to control the silicon concentration to less than $1 \times 10^{15}$ cm$^{-3}$. At the same time, in the case of the commonly used quartz boat growth method, as it is more desired to reduce $N_{Si}$, sticking is more liable to occur between the gallium arsenide melt and quartz boat, thus resulting in lowering of the yield of the single crystal and enlarging of the dislocation density.

In FIG. 3, the condition to obtain a high resistivity is $N_{DD} + N_D > N_{AA} + N_A > N_D$ (oxygen type mixed semi-insulating crystal) or $N_{AA} + N_A > N_{DD} + N_D > N_A$ (chromium type mixed semi-insulating crystal). In the semi-insulating gallium arsenide as shown n FIG. 3, a thermally stable semi-insulating gallium arsenide crystal is obtained by controlling so that $N_{DD} + N_{AA}$ be larger than $N_D + N_A$. In this case, however, the tolerance of $N_D$, etc., to realize a high resistivity is surely enlarged as compared with FIG. 1 and FIG. 2, but, if $N_{AA}$ (=$N_{Cr}$) is decreased to about $1 \times 10^{16}$ cm$^{-3}$ in view of the crystalline quality, $N_D$ must be adjusted to less than $3 \times 10^{15}$ cm$^{-3}$. On the other hand, if $N_D = N_{Si}$, $N_{Si}$ must be more than $7 \times 10^{14}$ cm$^{-3}$ in order to prevent "sticking." Since it is difficult to control precisely the concentration of silicon within a range of from $7 \times 10^{14}$ to $3 \times 10^{15}$ cm$^{-3}$ together with the concentration distribution in the crystal because of the foregoing reason, the reproducibility of a high resistivity is found insufficient.

Figure 4:
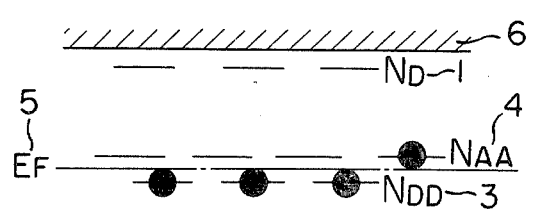

In FIG. 3, it can be proved that $N_{AA} > N_D - N_A > -N_{DD}$ is the essential and ample condition in order that a gallium arsenide crystal be either the above described oxygen-type mixed semi-insulating crystal or chromium-type mixed semi-insulating crystal, but the relationship between the deep donor level and deep acceptor level can sometimes be, reversely to FIG. 3, such that the deep acceptor level is nearer the conduction band than the deep donor level as shown in FIG. 4 and, in the case of FIG. 4, it can be proved that $N_{AA} > N_D - N_A > -N_{DD}$ is also the essential and ample condition in order that a gallium arsenide exhibits semi-insulating property. Thus it will be understood that the condition for obtaining a mixed type semi-insulating crystal containing a deep donor impurity and deep acceptor impurity at the same time is $N_{AA} > N_D - N_A > -N_{DD}$.

In the mixed type semi-insulating crystal of the prior art, however, chromium and oxygen are simultaneously doped and the residual silicon concentration (in this case, $N_D$) is adjusted to less than about $10^{15}$ cm$^{-3}$, so the right-sided inequality of $N_{AA} > N_D - N_A > -N_{DD}$ is sometimes not satisfied. As described above, it is difficult to control precisely silicon in such a small concentration including the concentration distribution thereof in the crystal. This difficulty can be avoided by increasing $N_D$ and further increasing $N_{AA}$.

The present invention provides a semi-insulating gallium arsenide having a high resistivity as well as a high crystalline quality with a very high reproducibility even if the concentration of chromium is rendered low, considering that the solubility of chromium is $(3 \sim 4) \times 10^{17}$ cm$^{-3}$.

That is to say, the present invention provides a semi-insulating gallium arsenide single crystal containing at least one of deep acceptor impurities and at least one of deep donor impurities and having a resistivity of $10^6$ $\Omega \cdot$cm or more at 300° K., in which (1) at least one of the deep donor impurities is oxygen, the oxygen concentration in the single crystal being adjusted to about $4 \times 10^{16}$ cm$^{-3}$ or more by adjusting the silicon concentration in the single crystal to about $2 \times 10^{15}$ cm$^{-3}$ or less, (2) at least one of the deep acceptor impurities is chromium, the chromium concentration in the single crystal being within a range of from about $3 \times 10^{15}$ cm$^{-3}$ to about $3 \times 10^{17}$ cm$^{-3}$ and (3) at least one of tellurium, tin, selenium and sulfur is contained as another shallow donor impurity than silicon so as to satisfy the relationship of $N_{AA} > N_D - N_A > -N_{DD}$ wherein $N_{AA}$ represents the sum of concentrations of the deep acceptor impurities including chromium, $N_{DD}$ represents the sum of concentrations of the deep donor impurities including oxygen, $N_D$ represents the sum of concentrations of the shallow donor impurities including electrically active lattice defects and $N_A$ represents the sum of concentrations of the shallow acceptor impurities including electrically active lattice defects.

In the present invention, the above described $N_D$ value is preferably within a range of from $2 \times 10^{15}$ cm$^{-3}$ to $3 \times 10^{17}$ cm$^{-3}$. In another embodiment of the present invention, there is provided a high grade semi-insulating gallium arsenide single crystal having a small dislocation density, in which at least one of the above described deep acceptor impurities is chromium with a density of from $6 \times 10^{15}$ cm$^{-3}$ to $1.2 \times 10^{16}$ cm$^{-3}$ and the above described $N_D$ is smaller than the above described chromium concentration and larger than $2 \times 10^{15}$ cm$^{-3}$.

Referring to FIG. 4, the semi-insulating gallium arsenide single crystal of the present invention will now be illustrated.

(1) When $N_D = N_{Si} + N_X$ (X=Te, Se, S, Sn) and $N_X > N_{Si}$, $N_X$ can be controlled independently on $N_O$ ($=N_{DD}$), so $N_D$ ($\approx N_X$) and $N_{DD}$ can have independent values and thus $N_A$ is rendered resistant to fluctuation, for example, by processing by increasing $N_{DD}$.

(2) The concentrations of tellurium, selenium, sulfur and tin are hardly affected by the quantity of residual oxygen and temperature distribution like silicon and consequently can be controlled with good reproducibility within a density range of $1 \times 10^{16}$ cm$^{-3}$ or less.

(3) Since the segregation coefficients of tellurium and tin are respectively $2 \times 10^{-2}$ and $2 \times 10^{-3}$ being smaller than $1.4 \times 10^{-1}$ of silicon according to the inventors' data, they can be added to starting materials in large amounts to retain a same small quantity in the crystal, so that the weighing error can be reduced and control of the doping can be effected with good reproducibility.

(4) Since $N_D$ can readily be controlled, the fluctuation range of $N_D - N_A$ can be reduced and $N_{AA}$ can correspondingly be reduced. That is to say, the doping level of chromium may be low and, consequently, the yield of the single crystal is increased while the crystalline quality is also elevated.

Figure 5:
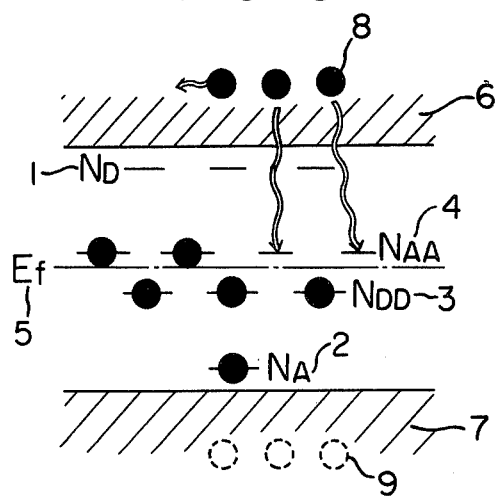
FIG. 5 shows an energy band model when light is incident on the single crystal.

When a semi-insulating gallium arsenide is illuminated with a light having an energy of more than the energy gap, electron 8 is excited from the valence band to the conduction band while positive hole 9 is generated in the valence band as shown in FIG. 5. Considering that, of the thus generated free carriers, large mobility electrons predominantly serve to lower the resistivity, the number of electrons excited per unit time and unit volume, g is given by the following relation:

$$g = f \times \sigma \times Nc \quad (1)$$

in which f is an illumination flux density, $\sigma$ is a photoionization sectional area and Nc is a state density in the conduction band.

On the other hand, a part of the ionized electrons is captured. This trapping rate ($\gamma$) is given as follows, $$\gamma = n < V \cdot S > N^\circ_{AA} \quad (2)$$

in which n is a free electron concentration, V is a thermal velocity, S is a capture cross section and $N^\circ_{AA}$ is the concentrations of a vacant deep acceptor, $N^\circ_{AA}$ being represented by $N^\circ_{AA} \approx N_{AA} - (N_D - N_A)$. The concentration of the electrons, n, remaining in the conduction band and serving to conduction is given as follows, $$n = f \cdot \sigma \cdot Nc / < V \cdot S > N^\circ_{AA} \propto 1/N^\circ_{AA} \quad (3)$$

since the formula (1)=the formula (2) under stable state. As is evident from the above described formula (3), the resistivity is lowered by illumination with the increase of n and decrease of $N^\circ_{AA}$ and, therefore, a vacant deep acceptor concentration having at least a certain value is found necessary in order to hold a high resistivity even under illumination.

Figure 6:
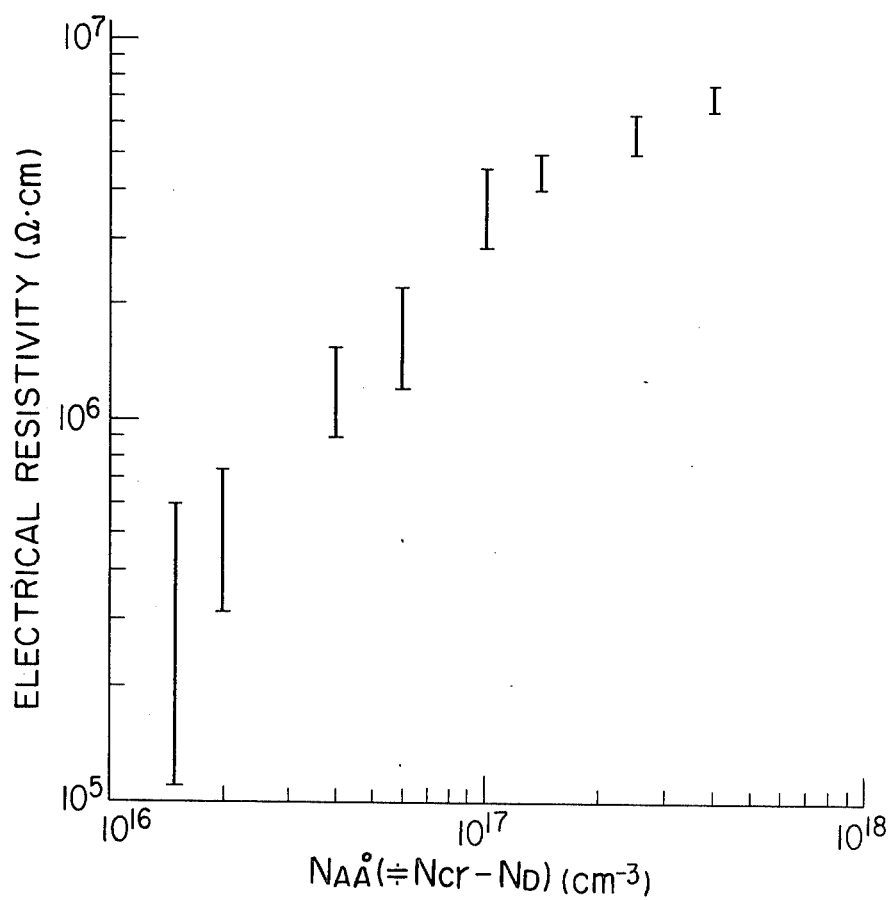
FIG. 6 shows the relationship between the resistivity and vacant deep acceptor (chromium) concentration of the semi-insulating gallium arsenide single crystal.

In FIG. 6 is shown the relationship between the electrical resistivity and vacant acceptor level concentration $N^\circ_{AA}$ when illuminated using a fluorescent lamp of 10 watts and 3,500 luxes. The severest conditions are used for the intensity and wavelength of the light considering the intensity and wavelength of a light in an environment wherein an element using a semi-insulating gallium arsenide is used. On the other hand, as the vacant acceptor level concentration $N^\circ_{AA}$, there is used the difference between the concentration of chromium ($N_{Cr}$) and the sum of the concentrations of silicon, tellurium, tin, selenium and sulfur ($N_D$), measured by mass spectro analysis of the crystal, that is to say, $N_{Cr} - N_D$. It is apparent from FIG. 6 that $N^\circ_{AA}$ should be more than about $4 \times 10^{16}$ cm$^{-3}$ in order that the resistivity of a semi-insulating gallium arsenide crystal is more than $1 \times 10^6$ $\Omega \cdot$cm which is ordinarily considered as a lower limit, while the upper limit of $N^\circ_{AA}$ of the range within which a good quality single crystal can be obtained is about $3 \times 10^{17}$ cm$^{-3}$ in view of that the solubility of chromium, a typical example of deep acceptor impurities, is about $3 \times 10^{17}$ cm$^{-3}$. In one preferred embodiment of the present invention, the upper limit and lower limit of $N^\circ_{AA}$ is thus defined as above. The dark resistivities of the semi-insulating gallium arsenide single crystals shown in FIG. 6, that is, resistivities in the absence of illumination are all more than $10^7$ $\Omega \cdot$cm.

Figure 7:
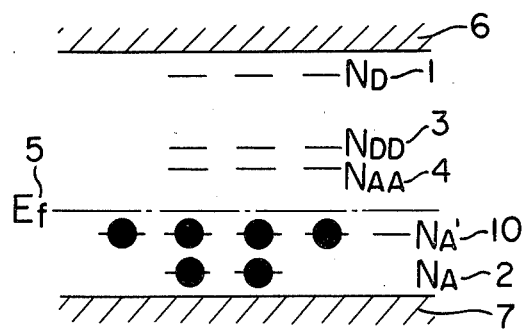
FIG. 7 shows an energy band model to illustrate the basic principle of the invention when the crystal is processed.

The following illustration is concerned with a case where a semi-insulating single crystal is subjected to processings such as epitaxial growth, annealing, etc. Referring to FIG. 7, the case of using a mixed semi-insulating gallium arsenide single crystal satisfying the relation of $N_{AA} > N_D - N_A > -N_{DD}$ will now be illustrated. When shallow acceptors occur during processing to give a density of $N_A'$, the relation of $N_{AA} > N_D - (N_A + N_A') > -N_{DD}$ must be satisfied in order to keep the semi-insulating property. In a single crystal satisfying $N_{AA} > N_D - N_A$, the left side of this relation is properly satisfied, but, in the right side thereof, $N_D - N_A > -N_{DD} + N_A'$ is not always satisfied after processing even if $N_D - N_A > -N_{DD}$ is satisfied before processing. If the inequality of the right side is not satisfied, the Fermi level approaches the valence band, so that the crystal is converted into p-type and cannot hold the semi-insulating property. In order to compensate $N_A'$ newly occurred by processing and keep the Fermi level near the center of the forbidden band, it is an essential and ample condition to dope impurities so that $N_D$, $N_A$ and $N_{DD}$ may satisfy the relation of $N_D - N_A > -N_{DD} + N_A'$. Another case where the crystal is converted into n-type can similarly be illustrated.

As is evident from the foregoing illustration, a really stable semi-insulating gallium arsenide single crystal capable of compensating electrically active donors and acceptors formed by processing for the production of an element and thus keeping the semi-insulating property even after processing can effectively be provided by preferred embodiments of the present invention. That is to say, in one embodiment of the gallium arsenide single crystal according to the present invention, chromium is contained in a concentration of about $1 \times 10^{17}$ cm$^{-3}$ or more as at least one of the deep acceptor impurities so as to satisfy the relation of $N_{AA} - N_D' > N_D - N_A > -N_{DD} + N_A'$ in the region of about 200 Å or less from the surface of the single crystal when processed in a suitable environment. In this relation, $N_D'$ and $N_A'$ represent respectively the concentrations of relatively shallow donors including vacancies of Group V elements and relatively shallow acceptors including vacancies of Group III elements, which are formed by processing the single crystal. In another embodiment of the gallium arsenide single crystal according to the present invention, oxygen is contained in a concentration of about $8 \times 10^{16}$ cm$^{-3}$ or more as at least one of the deep donor impurities so as to satisfy the relation of $N_{AA} - N_D' > N_D - N_A > -N_{DD} + N_A'$ in the region of about 200 Å or more from the surface of the single crystal when processed in a suitable environment. In a further embodiment of the gallium arsenide single crystal according to the present invention, chromium is contained in a concentration of about $1 \times 10^{17}$ cm$^{-3}$ or more as at least one of the deep acceptor impurities and oxygen is contained in a concentration of about $8 \times 10^{16}$ cm$^{-3}$ or more as at least one of the deep donor impurities so as to satisfy the relation of $N_{AA} - N_D' > N_D - N_A > -N_{DD} + N_A'$ in the region of about 2 μm or less from the surface of the single crystal when processed in a suitable environment.

The concentrations of electrically active acceptors and donors newly formed by processing will now be taken into consideration as to gallium arsenide. When a semi-insulating gallium arsenide is subjected to an annealing treatment in hydrogen gas at 700° to 900° C., arsenic vacancies and gallium vacancies are formed in a concentration of about $10^{16}$ to $10^{18}$ cm$^{-3}$ on the surface thereof to keep the thermodynamic equilibrium and then diffused in the substrate. These vacancies are considered to act respectively as electrically active shallow donor and acceptors. The diffusion depths of these shallow donors and acceptors, calculated using the diffusion coefficient described in "Journal of Applied Physics," Vol. 46, page 2986-2991 (1975), are as shown in FIG. 8 when the annealing treatment is carried out at 800° C. for 2 hours in hydrogen. It is apparent from this figure that the semi-insulating gallium arsenide is affected by the relatively shallow donors and acceptors of $10^{14}$ cm$^{-3}$ or more from the surface to a depth of several μm. The converted layer of the surface is so thin that it can sufficiently be removed by, for example, a gas etching step before the start of a vapor phase epitaxial growth or a melt back step before the start of a liquid phase epitaxial growth, but, when the above described step is not employed or depending upon the environment during epitaxial growth at a high temperature, there is a considerable possibility of introducing the converted layer, resulting in deterioration of the properties of an element. In gallium arsenide, arsenic vacancies and gallium vacancies occurring during processing are compensated by composite materials of these vacancies with other impurities and, accordingly, electrically active $N_A'$ and $N_D'$ are at most $1 \times 10^{17}$ cm$^{-3}$. The gallium arsenide single crystals set forth in the foregoing three embodiments of the present invention define the impurities doping conditions for a stable semi-insulating gallium arsenide in the case of estimating the electrically active acceptors and donors formed by processing in a concentration that is considered to be effective in practice.

Then a semi-insulating gallium arsenide capable of holding a high resistivity under illumination even after being subjected to processing will be illustrated. In a still further embodiment of the gallium arsenide single crystal according to the present invention, chromium is contained in a concentration ranging from $1.5 \times 10^{17}$ cm$^{-3}$ to $3 \times 10^{17}$ cm$^{-3}$ as at least one of the deep acceptor impurities so as to satisfy the relation of $3 \times 10^{17}$ cm$^{-3} > N_{AA} - ((N_D + N_D') - (N_A + N_A')) > 4 \times 10^{16}$ cm$^{-3}$ in the region of about 2 μm or less from the surface of the single crystal when processed in a suitable environment. That is, the deep acceptor concentration after being subjected to processing is represented by $N_{AA} - ((N_D + N_D') - (N_A + N_A'))$. As apparent from FIG. 6, this value is preferably about $4 \times 10^{16}$ cm$^{-3}$. It will clearly be understood that the practically effective $N_D' - N_A'$ can be regarded as about $1 \times 10^{17}$ cm$^{-3}$. Consequently, a a semi-insulating gallium arsenide containing chromium in a concentration of about $1.5 \times 10^{17}$ cm$^{-3}$ or more as at least one of $N_{AA}$ is stable for illumination even after being processed.

The following examples are given in order to illustrate the present invention in detail without limiting the same.

EXAMPLE 1

FIG. 9 shows a schematic view of a crystal growing furnace of three temperature zone type used for the production of a semi-insulating gallium arsenide in this example, the temperature distribution graph in the furnace and a crystal growing vessel.

As shown in FIG. 9, the crystal growing furnace was provided with a high temperature heating zone 19 at about 1245° to 1270° C. (T$_1$), medium temperature heating zone 20 at about 1080° to 1200° C. (T$_2$) and low temperature heating zone 21 wherein heating (T$_3$) was carried out so as to give an arsenic vapor pressure of about 1 atmosphere. As a boat for loading gallium arsenide there was used a quartz boat 17 and as a sealed vessel 11 for loading quartz boat 17 there was used a vessel having a chamber for loading quartz boat 17, chamber for loading arsenic 15 and narrow hole section 16, being arranged between these chambers, for admitting the passage of arsenic vapor but hindering the passage of vapors of gallium oxide and silicon oxide, the distance (L$_2$) between the boundary line of the above described quartz boat-loaded chamber and arsenic-loaded chamber and the lowest temperature position of the above described medium temperature heating zone 20 being adjusted to substantially same as or longer than the total length (L$_1$) of quartz boat 17.

550 g of gallium (purity: 99.9999%), 500 mg of chromium, 5 mg of tellurium and 30 mg of arsenic oxide (AS$_2$O$_3$) were charged in quartz boat 17 while 600 g of arsenic (purity: 99.9999%) was charged in the lower temperature portion of sealed vessel 11, and a gallium arsenide single crystal was grown at a growth rate of about 2 to 10 mm/hour. In the resultant crystal, there was found no "sticking" to quartz boat 17. When {1 1 1}Ga surface vertical to the longitudinal direction of this crystal was etched with a mixture of 3H$_2$SO$_4$:1-H$_2$O$_2$:1H$_2$O at room temperature for about 10 minutes and the etch pit density was measured, it was found that the dislocation density was about 2,000 cm$^{-2}$ at the front end and about 3,000 cm$^{-2}$ at the rear end. When this crystal was subjected to measurement of the electric resistance by the Van der Pauw's method, furthermore, the resistivity was $2 \times 10^8$ Ω·cm at 300° K., and the leakage current measured by the probing method was 1 μA or less at 1,000 volts over the measured whole surface of the wafer. When this crystal was subjected to mass spectro analysis, it was found that in the crystal were contained about $1 \times 10^{15}$ cm$^{-3}$ of silicon, about $8 \times 10^{15}$ cm$^{-3}$ tellurium, about $1.5 \times 10^{16}$ cm$^{-3}$ of chromium and about $8 \times 10^{16}$ cm$^{-3}$ of oxygen.

EXAMPLE 2

The procedure of Example 1 was repeated except that chromium was used in an amount of 250 mg and tellurium was used in an amount of 3 mg in the production of a gallium arsenide single crystal by the three temperature zone horizontal Bridgman method according to Example 1.

In the resulting crystal, the quantity of chromium was reduced and the dislocation density was about 1,000 cm at the front end and about 2,500 cm$^{-2}$ at the rear end. When this crystal was subjected to measurement of the electric resistance by the Van der Pauw's method, the resistivity was $2\times 10^8$ Ω·cm at 300° K. Furthermore, in this crystal were contained about $1\times 10^{15}$ cm$^{-3}$ of silicon, about $5\times 10^{15}$ cm$^{-3}$ of tellurium, about $8\times 10^{15}$ cm$^{-3}$ of chromium and about $1\times 10^{17}$ cm$^{-3}$ of oxygen.

By adjusting the concentration of silicon as a shallow donor to $2\times 10^{15}$ cm$^{-3}$ or less, in particular, $5\times 10^{14}$ cm$^{-3}$ to $2\times 10^{15}$ cm$^{-3}$ and further adding at least one of tellurium, tin, selenium and sulfur in the range of from $2\times 10^{15}$ cm$^{-3}$ to $3\times 10^{17}$ cm$^{-3}$, the yield of a high resistivity single crystal is largely increased to approximately 100% as compared with about 70% of the prior art wherein only silicon is added as a shallow donor.

In the above described Examples, the present invention is illustrated as to gallium arsenide single crystals produced by the horizontal type Bridgman method, but, of course, the present invention is applicable to gallium arsenide crystals produced by the zone melting method, gradient freeze method and liquid encapsulation Czochralski method similarly.

As described above, in accordance with the present invention, there is provided a mixed type semi-insulating gallium arsenide single crystal containing deep donors and deep acceptors and having a resistivity of $10^6$ Ω·cm or more, which is a high grade single crystal with less defects such as dislocation density and expected to render great services to the industry as a semi-insulating substrate single crystal for MESFET, optical IC, etc. Moreover, the yield of the single crystal is increased as compared with the semi-insulating crystal of the prior art, resulting in reduction of the production cost as well as possibility of the mass production.

EXAMPLE 3

In the production of a gallium arsenide single crystal by the three temperature zone horizontal Bridgman method according to Example 1, 550 g of gallium (purity: 99.9999%), 5 g of chromium, 6 mg of tellurium and 30 mg of arsenic oxide ($AS_2O_3$) were charged in quartz boat 17 while 660 g of arsenic (purity: 99.9999%) was charged in the lower temperature portion of sealed vessel 11, and a gallium arsenide single crystal was thus grown at a growth rate of about 2 to 5 mm/hour.

When the thus resulting crystal was subjected to measurement of the electrical resistivity by the Van der Pauw's method, the resistivity was about $2\times 10^8$ Ω·cm at 300° K. in the absence of illumination. The leakage current on the surface measured by the probing method (needle diameter: about 50 μm) was about 0.01 μA to an applied voltage of 1,000 volts over the whole wafer surface mirror polished and, when this wafer was further illuminated using a fluorescent lamp of 3,500 luxes and 10 watts, it was about 0.5 μA to 1,000 volts, corresponding to a resistivity of about $4\times 10^6$ Ω·cm. On the other hand, when this crystal was subjected to mass spectro analysis, it was found that about $1\times 10^{15}$ cm$^{-3}$ of silicon, about $1\times 10^{16}$ cm$^{-3}$ of tellurium, about $1.5\times 10^{17}$ cm$^{-3}$ of chromium and about $6\times 10^{16}$ cm$^{-3}$ were contained in the crystal.

EXAMPLE 4

The wafer of Example 3 was illuminated by a tungsten lamp of 500 luxes and 100 watts and subjected to measurement of the leakage current by the probing method to give about 0.3 μA to 1,000 volts, corresponding to about $7\times 10^6$ Ω·cm.

In FIG. 6 were also shown the properties of crystals produced by other doping conditions in addition to the above described results. For example, when the procedure of Example 3 was repeated except that about 1 g of chromium was used, the same results as those of Example 3 were obtained except that the density of chromium was about $3\times 10^{16}$ cm$^{-3}$. This crystal showed a leakage current of about 0.04 μA (corresponding to about a resistivity of about $5\times 10^7$ Ω·cm) for an applied voltage of 1,000 volts in the absence of illumination, but the leakage current was increased to about 4 μA when illuminated using a fluorescent lamp of 3,500 luxes and 10 watts, this leakage current corresponding to a resistivity of about $5\times 10^5$ Ω·cm. This case is a comparative example.

Furthermore, when the procedure of Example 3 was repeated except that about 13 g of chromium was used, the same results as those of Example 3 were obtained except that the density of chromium was about $4\times 10^{17}$ cm$^{-3}$. This crystal showed a leakage current of about 0.005 μA (corresponding to a resistivity of about $4\times 10^8$ Ω·cm) to an applied voltage of 1,000 volts in the absence of illumination and the leakage current was about 0.3 μA even under illumination by a tungsten lamp of 500 luxes and 100 watts, this leakage current corresponding to a resistivity of about $7\times 10^6$ Ω·cm. When the mirror polished wafer of this crystal was viewed by means of a microscope, however, several precipitates were found in the surface.

It will clearly be understood from these examples and comparative examples that according to the present invention, there is provided a stable semi-insulating gallium arsenide single crystal capable of keeping a high electric resistivity even in an environment such as under illumination of light.

EXAMPLE 5

In the production of a semi-insulating gallium arsenide single crystal according to Example 1, 550 g of gallium (purity: 99.9999%), 5 g of chromium, 6 mg of tellurium and 30 mg of arsenic oxide ($AS_2O_3$) were charged in quartz boat 17 while 660 g of arsenic (purity: 99.9999%) was charged in the lower temperature portion of sealed vessel 11, and a gallium arsenide single crystal was thus grown at a growth rate of about 2 to 10 mm/hour.

When the thus resulting crystal was subjected to measurement of the electric resistivity by the Van der Pauw's method, the resistivity was about $2\times 10^8$ Ω·cm at 300° K. and the leak current on the surface measured by the probing method was about 1 μA or less over the whole surface of the measured wafer to an applied voltage of 1,000 volts. When this crystal was subjected to mass spectro analysis, it was found that about $1\times 10^{15}$ cm$^{-3}$ of silicon, about $1\times 10^{16}$ cm$^{-3}$ of tellurium, about $1.5\times 10^{17}$ cm$^{-3}$ of chromium and about $8\times 10^{16}$ cm$^{-3}$ of oxygen were contained in the crystal. When this crystal was subjected to an annealing treatment at 800° C. in hydrogen gas for about 2 hours and to a step etching of 200 Å from the surface at one time using an etching solution of phosphoric acid-hydrogen peroxide type and the leak current was measured by the probing method, it was found that the crystal showed a semi-insulating property of 1 μA or less at an applied voltage of 1,000 volts from the surface to the inside of 5 microns.

EXAMPLE 6

In the production of a gallium arsenide single crystal by the three temperature zone horizontal Bridgman method according to Example 3, the similar procedure to Example 3 was carried out except that 500 mg of chromium was used, thus obtaining a similar crystal to that of Example 3, but having a chromium concentration of about $1.5 \times 10^{16}$ cm$^{-3}$. This crystal showed a leakage current of 1 μA or less at an applied voltage of 1,000 volts before annealing, but it was found that the surface layer of about 200 Å was converted into an n-type conduction layer by an annealing treatment at 800° C. in hydrogen gas for 2 hours but the other portion inside the surface layer kept the semi-insulating property.

EXAMPLE 7

In the production of a gallium arsenide single crystal by the three temperature zone horizontal Bridgman method according to Example 1, the procedure of Example 1 was repeated except that 5 g of chromium, 5 mg of arsenic oxide (AS$_2$O$_3$) and 6 mg of tellurium were used, thus growing a gallium arsenide single crystal. This crystal contained about $1.5 \times 10^{17}$ cm$^{-3}$ of chromium, about $6 \times 10^{15}$ cm$^{-3}$, about $1.5 \times 10^{16}$ cm$^{-3}$ of oxygen and about $1 \times 10^{16}$ cm$^{-3}$ of tellurium. This crystal had an electric resistivity of about $2 \times 10^{8}$ Ω·cm before annealing and a leak current by the probing method of 1 μA or less at 1,000 volts before annealing. When the same annealing treatment as that of Example 3 was carried out, however, a surface layer of several hundreds Å showed the semi-insulating property, but a layer of a depth of several hundreds Å to several thousands Å had a relatively high resistivity and was converted into a p-type conduction and a further deeper layer kept again the insulating property.

EXAMPLE 8

In the production of a gallium arsenide single crystal according to Example 5, the procedure of Example 5 was repeated except that chromium was doped in an amount of 7 g. The resulting crystal contained about $2.2 \times 10^{17}$ and cm$^{-3}$ of chromium, about $8 \times 10^{16}$ cm$^{-3}$ of oxygen, about $1 \times 10^{15}$ cm$^{-3}$ of silicon and about $1 \times 10^{16}$ cm$^{-3}$ of tellurium. When this crystal was subjected to an annealing treatment in an analogous manner to Example 5 and then the surface leak current was measured by the probing method, it was found that a layer of from the surface to a depth of about 2 μm had a semi-insulating property of 1 μA or less at 1,000 volts. When the surface of this annealed wafer was illuminated with a fluorescent lamp of 3,500 luxes and 10 watts and subjected to measurement of the surface leak current by the probing method, a semi-insulating property of about 0.5 μA to 1,000 volts was kept. This example shows a semi-insulating gallium arsenide single crystal being stable for light even after annealing.

As evident from Examples 1 to 8, the present invention can provide a process for the production of a high resistivity and high crystalline quality semi-insulating gallium arsenide single crystal in stable manner and provide a semi-insulating gallium arsenide single crystal being stable for light and processings such as annealing, etc. Therefore, the present invention serves to a great extent to increase the reliability of microwave elements, optical semiconductor elements, etc.

What is claimed is:

1. A semi-insulating gallium arsenide single crystal containing at least one of deep acceptor impurities and at least one of deep donor impurities and having a resistivity of at least about $10^6$ Ω·cm at 300° K., in which (1) at least one of the deep donor impurities is oxygen, the oxygen concentration in the single crystal being at least about $4 \times 10^{16}$ cm$^{-3}$, while the silicon concentration in the single crystal is simultaneously at most about $2 \times 10^{15}$ cm$^{-3}$, (2) at least one of the deep acceptor impurities is chromium in a concentration of at least about $1 \times 10^{17}$ cm$^{-3}$ so as to satisfy the relation of $N_{AA} - N_D' > N_D - N_A > -N_{DD} + N_A'$ in the region of at most about 200 Å from the surface of the single crystal when annealed at 700°–900° C., wherein $N_D'$ and $N_A'$ represented respectively the concentrations of relatively shallow donors including vacancies of Group V elements and relatively shallow acceptors including vacancies of Group III elements, which are formed when the single crystal is annealed at 700°–900° C., and wherein $N_{DD}$, $N_{AA}$, $N_D$ and $N_A$ are as defined below, and (3) at least one of tellurium, tin, selenium and sulfur is contained as another shallow donor impurity than silicon, said ingredients all being present in such amounts as to satisfy the relationship of $N_{AA} > N_D - N_A > -N_{DD}$ wherein $N_{AA}$ represents the sum of concentrations of the deep acceptor impurities including chromium, $N_{DD}$ represents the sum of concentrations of the deep donor impurities including oxygen, $N_D$ represents the sum of concentrations of the shallow donor impurities including electrically active lattice defects and $N_A$ represents the sum of concentrations of the shallow acceptor impurities including electrically active lattice defects.

2. A semi-insulating gallium arsenide single crystal containing at least one of deep acceptor impurities and at least one of deep donor impurities and having a resistivity of at least about $10^6$ Ω·cm at 300° K., in which (1) at least one of the deep donor impurities is oxygen in a concentration of at least about $8 \times 10^{16}$ cm$^{-3}$, while the silicon concentration in the single crystal is simultaneously at most about $2 \times 10^{15}$ cm$^{-3}$, said oxygen being present in such concentrations as to satisfy the relation of $N_{AA} - N_D' > N_D - N_A > -N_{DD} + N_A'$ in the region of at least about 200 Å from the surface of the single crystal when annealed at 700°–900° C., wherein $N_D'$ and $N_A'$ represent respectively the concentrations of relatively shallow donors including vacancies of Group V elements and relatively shallow acceptors including vacancies of Group III elements, which are formed when the single crystal is annealed at 700°–900° C., and wherein $N_{AA}$, $N_{DD}$, $N_A$ and $N_D$ are as defined below, (1) at least one of the deep acceptor impurities is chromium, the chromium concentration in the single crystal being within a range of about $3 \times 10^{15}$ cm$^{-3}$ to about $3 \times 10^{17}$ cm$^{-3}$ and (3) at least one of tellurium, tin, selenium and sulfur is contained as another shallow donor impurity than silicon said ingredients all being present in such amounts as to satisfy the relationship of $N_{AA} > N_D - N_A > -N_{DD}$ wherein $N_{AA}$ represents the sum of concentrations of the deep acceptor impurities including chromium, $N_{DD}$ represents the sum of concentrations of the deep donor impurities including oxygen, $N_D$ represents the sum of concentrations of the shallow donor impurities including electrically active lattice defects and $N_A$ represents the sum of concentrations of the shallow acceptor impurities including electrically active lattice defects.

3. A semi-insulating gallium arsenide single crystal containing at least one of deep acceptor impurities and at least one of deep donor impurities and having a resistivity of at least about $10^6$ Ω·cm at 300° K. in which (1) at least one of the deep donor impurities is oxygen in a concentration of at least about $8 \times 10^{16}$ cm$^{-3}$, while the silicon concentration in the single crystal is simultaneously at most about $2 \times 10^{15}$ cm$^{-3}$, (2) at least one of the deep acceptor impurities is chromium in a concentration of $1 \times 10^{17}$ cm$^{-3}$, said oxygen and chromium being present in such amounts as to satisfy the relation of $N_{AA} - N_D' > N_D - N_A > -N_{DD} + N_A'$ in the region of at most about 2 μm from the surface of the single crystal when annealed at 700°-900° C., wherein $N_D'$ and $N_A'$ represent respectively the concentrations of relatively shallow donors including vacancies of Group V elements and relatively shallow acceptors including vacancies of Group III elements, which are formed when the single crystal is annealed at 700°-900° C., and $N_{AA}$, $N_{DD}$, $N_A$ and $N_D$ are as defined below, and (3) at least one of tellurium, tin, selenium and sulfur is contained as another shallow donor impurity than silicon, said ingredients all being present in such amounts as to satisfy the relationship of $N_{AA} > N_{D-NA} > -N_{DD}$ wherein $N_{AA}$ represents the sum of concentrations of the deep acceptor impurities including chromium, $N_{DD}$ represents the sum of concentrations of the deep donor impurities including oxygen, $N_D$ represents the sum of concentrations of the shallow donor impurities including electrically active lattice defects and $N_A$ represents the sum of concentrations of the shallow acceptor impurities including electrically active lattice defects.

4. The semi-insulating gallium arsenide single crystal as claimed in claim 3, wherein chromium is contained as at least one of the deep acceptor impurities in a concentration ranging from $1.5 \times 10^{17}$ cm$^{-3}$ to $3 \times 10^{17}$ cm$^{-3}$ so as to satisfy the relation of $3 \times 10^{17}$ cm$^{-3} > N_{AA} - ((N_D + N_D') - (N_A + N_A')) > 4 \times 10^{16}$ cm$^{-3}$ in the region of at most about 2 μm from the surface of the single crystal when processed in a suitable environment.

* * * * *